(12) United States Patent
Tsutsumi et al.

(10) Patent No.: US 11,088,697 B2
(45) Date of Patent: Aug. 10, 2021

(54) PLL CIRCUIT (71) Applicant: MITSUBISHI ELECTRIC CORPORATION, Tokyo (JP)

(72) Inventors: Koji Tsutsumi, Tokyo (JP); Yuki Yanagihara, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 113 days.

(21) Appl. No.: 16/615,471

(22) PCT Filed: Jul. 4, 2017

(86) PCT No.: PCT/JP2017/024498
§ 371 (c)(1),
(2) Date: Nov. 21, 2019

(87) PCT Pub. No.: WO2019/008672
PCT Pub. Date: Jan. 10, 2019

(65) Prior Publication Data
US 2020/0083894 A1    Mar. 12, 2020

(51) Int. Cl.
| H03L 7/087 | (2006.01) |
| H03L 7/197 | (2006.01) |
| H03L 7/093 | (2006.01) |
| H03L 7/099 | (2006.01) |
| H03L 7/089 | (2006.01) |

(52) U.S. Cl.
CPC .............. H03L 7/197 (2013.01); H03L 7/087 (2013.01); H03L 7/089 (2013.01); H03L 7/093 (2013.01); H03L 7/0992 (2013.01); H03L 7/1976 (2013.01)

(58) Field of Classification Search
CPC ......... H03L 7/087; H03L 7/089; H03L 7/093; H03L 7/0992; H03L 7/197; H03L 7/1976
See application file for complete search history.

(56) References Cited

U.S. PATENT DOCUMENTS

| 8,120,394 | B2 * | 2/2012 | Tarng | .................... H03L 7/1976 |
| | | | | 327/156 |
| 8,184,761 | B2 * | 5/2012 | Vaananen | ............. H03L 7/0891 |
| | | | | 375/376 |

(Continued)

OTHER PUBLICATIONS

El-Shennawy et al., "Fractional-N PLL Optimization for Highly Linear Wideband Chirp Generation for FMCW Radars", 2015 German Microwave Conference, pp. 248-251.

*Primary Examiner* — Patrick O Neill
(74) *Attorney, Agent, or Firm* — Birch, Stewart, Kolasch & Birch, LLP.

(57) ABSTRACT

A phase-frequency comparator compares a reference signal with an output signal from a variable frequency divider, and outputs an up signal of frequency and a down signal of frequency depending on results of the comparison. An AND circuit performs an AND operation between the up signal and the down signal, and outputs a result of the operation as a retiming si al CLKretime. A flip-flop circuit holds an output signal from a frequency control circuit at timing of the output signal from the AND circuit, and outputs the held output signal. At ΔΣ modulator determines a division ratio for the variable frequency divider on the basis of the output from the flip-flop circuit.

4 Claims, 7 Drawing Sheets

(56) References Cited

U.S. PATENT DOCUMENTS

| | | | |
|---|---|---|---|
| 8,564,342 B2 * | 10/2013 | Yao | H03L 7/1976 |
| | | | 327/156 |
| 10,461,756 B2 * | 10/2019 | Tsutsumi | H03L 7/197 |
| 10,659,062 B2 * | 5/2020 | Yanagihara | H03L 7/197 |
| 2012/0038426 A1 * | 2/2012 | Tamura | H03L 7/0898 |
| | | | 331/25 |

* cited by examiner

PLL CIRCUIT

TECHNICAL FIELD

The present invention relates to a PLL circuit that generates, for example, a chirp signal which is used as a transmission wave of a frequency modulated continuous wave (FMCW) radar.

BACKGROUND ART

A PLL circuit is a circuit that compares the phase of an output signal from a voltage-controlled oscillator (hereinafter, referred to as VCO) with the phase of a reference signal, and feeds back a result of the comparison to the frequency control voltage of the VCO, and thereby stabilizes the oscillation frequency of the VCO. In the PLL circuit, by performing time control on a ratio between VCO frequency to reference signal frequency, a signal whose phase is modulated can be outputted from the VCO. By this, For example, a chirp signal used as a transmission wave of an FMCW radar can be generated by the PLL circuit.

For a conventional PLL circuit that generates a chirp signal, there is one in which a $\Delta\Sigma$ modulator controls a division ratio used when a variable frequency divider frequency-divides an output from the VCO, by which a fractional division ratio is achieved, and the output from the VCO is set to a frequency which is a fraction of a reference signal. Data inputted to the $\Delta\Sigma$ modulator is a value corresponding to an output frequency of the VCO, generated by a frequency control circuit and, for example, when data that increases little by little with time is used, a chirp signal whose frequency increases with time is outputted from the VCO.

Here, in general, the $\Delta\Sigma$ modulator needs to operate in synchronization with the variable frequency divider, and thus, operates using a frequency-divided signal (CLKdiv) which is an output from the variable frequency divider, as a clock. On the other hand, since modulation timing of a chirp signal is controlled by an external source, the frequency control circuit operates using a reference signal (CLKref) inputted from the external source, as a clock. Hence, from the frequency control circuit to the $\Delta\Sigma$ modulator, data transfer is performed between the circuits with different clock domains, and thus, timing needs to be sufficiently considered. Conventionally, for measures against such timing, there is a circuit in which a reference signal inputted to a phase-frequency comparator is inverted and used as a clock for the frequency control circuit, by which data transfer is stably performed (see, for example, Non-Patent Literature 1).

CITATION LIST

Patent Literatures

Non-Patent Literature 1: Mohammed El-Shennawy, Niko Joram, Frank Ellinger, "Fractional-N PLL Optimization for Highly Linear Wideband Chirp Generation for FMCW Radars", 2015 German Microwave Conference

SUMMARY OF INVENTION

Technical Problem

However, in a conventional circuit such as that described in the above-described Non-Patent Literature 1, for example, when the fluctuation range by the $\Delta\Sigma$ modulator is large or when the phase of an output from the VCO is shifted, performing only clock inversion (half clock delay) is not sufficient, and in some cases there is a problem that data transfer errors occur.

The invention is made to solve such a problem, and an object of the invention is to provide a PLL circuit capable of preventing occurrence of data transfer errors even when there is a large difference in timing between CLKref and CLKdiv.

Solution to Problem

A PLL circuit according to the invention includes a voltage-controlled oscillator to output a signal with a frequency depending on a frequency control voltage provided to the voltage-controlled oscillator; a variable frequency divider to frequency-divide the output signal from the voltage-controlled oscillator on a basis of a signal for a division ratio provided to the variable frequency divider; a phase-frequency comparator to compare a reference signal with an output signal from the variable frequency divider, and output an up signal of frequency and a down signal of frequency depending on results of the comparison; an AND circuit to output a result of an AND operation between the up signal and the down signal; a frequency control circuit to operate using the reference signal as a clock, and output a signal corresponding to an output frequency of the voltage-controlled oscillator; a flip-flop circuit to hold the output signal from the frequency control circuit at timing of an output signal from the AND circuit, and output the held output signal; a $\Delta\Sigma$ modulator for operating using the output from the variable frequency divider as a clock, and determine a division ratio for the variable frequency divider on a basis of the output from the flip-flop circuit; a charge pump to output a current corresponding to each of the up signal and the down signal; and a loop filter to output a signal obtained by performing current-voltage conversion and smoothing on the output from the charge pump, as the frequency control voltage, to the voltage-controlled oscillator.

Advantageous Effects of Invention

The PLL circuit according to the invention retimes a frequency value Freq_data which is outputted from the frequency control circuit, using an output from the AND circuit that outputs a result of an AND operation between an up signal and a down signal from the phase-frequency comparator. By this, even if there is a large difference in timing between CLKref and CLKdiv, occurrence of data transfer errors can be prevented.

DESCRIPTION OF EMBODIMENTS

To describe the invention in more detail, modes for carrying out the invention will be described below with reference to the accompanying drawings.

First Embodiment

Figure 1:
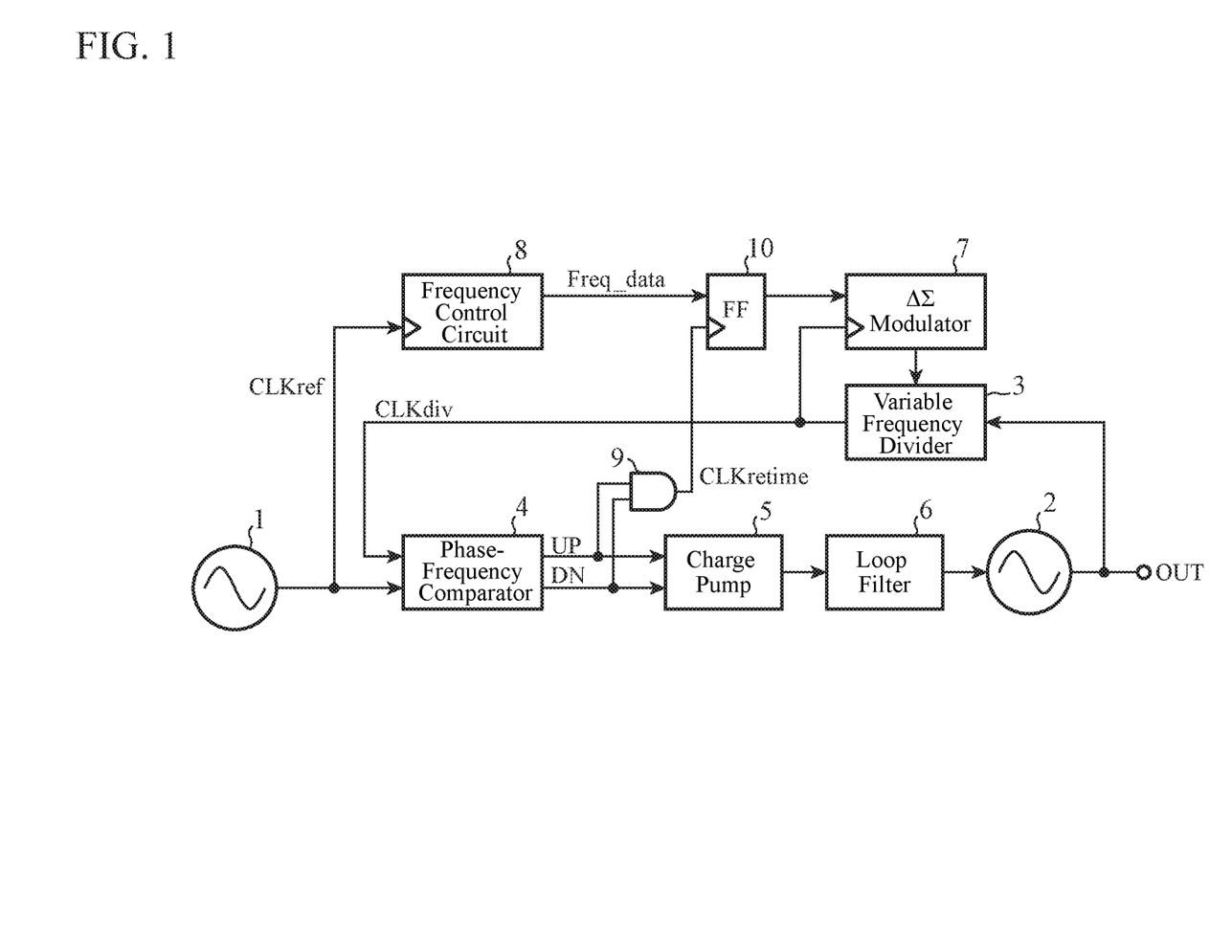
FIG. 1 is a configuration diagram showing a PLL circuit of a first embodiment of the invention.

FIG. 1 is a configuration diagram of a PLL circuit of the present embodiment.

The PLL circuit of the present embodiment includes a reference signal source (REF) 1, a voltage-controlled oscillator (VCO) 2, a variable frequency divider 3, a phase-frequency comparator 4, a charge pump 5, a loop filter 6, a ΔΣ modulator 7, a frequency control circuit 8, an AND circuit 9, and a flip-flop circuit (FF) 10. Note that in the following the reference signal source 1 will be described as REF 1, the voltage-controlled oscillator 2 as VCO 2, and the flip-flop circuit 10 as FF 10.

The REF 1 is a signal source that generates and outputs a clock serving as a reference signal CLKref. The VCO 2 is an oscillator that outputs a signal with a frequency depending on a frequency control voltage provided from the loop filter 6. The variable frequency divider 3 is a processing unit that frequency-divides the output signal from the VCO 2 on the basis of a signal for a division ratio which is provided from the ΔΣ modulator 7. The phase-frequency comparator 4 is a processing unit that compares phases and frequencies between the reference signal CLKref from the REF 1 and a frequency-divided signal CLKdiv outputted from the variable frequency divider 3, and outputs an up signal (UP) of frequency and a down signal (DN) of frequency depending on results of the comparison. The charge pump 5 is a processing unit that converts a digital signal including the up signal and the down signal from the phase-frequency comparator 4 to a current value of an analog signal. The loop filter 6 is a processing unit that performs current-voltage conversion and smoothing (integration) on the analog signal outputted from the charge pump 5. The ΔΣ modulator 7 is a processing unit that operates using the frequency-divided signal CLKdiv which is an output from the variable frequency divider 3, as a clock, and generates a division ratio pattern depending on a frequency value Freq_data outputted from the FF 10. The frequency control circuit 8 is a circuit that operates using the reference signal CLKref which is outputted from the REF 1, as a clock, and outputs a signal for a frequency value Freq_data corresponding to an output frequency of the VCO 2. The AND circuit 9 is a circuit that performs an AND operation between the up signal and the down signal which are outputted from the phase-frequency comparator 4, and outputs a result of the operation as a retiming signal CLKretime. The FF 10 is a circuit that operates using the retiming signal CLKretime which is outputted from the AND circuit 9, as a clock, and holds the frequency value Freq_data from the frequency control circuit 8 at a rising edge of the clock and outputs the held frequency value Freq_data.

Next, the operation of the PLL circuit of the first embodiment will be described.

A signal outputted from the VCO 2 which also serves as an output signal from the PLL circuit is frequency-divided by the variable frequency divider 3 and then provided to the phase-frequency comparator 4. The phase-frequency comparator 4 compares an output from the REF 1 with the output from the variable frequency divider 3 and outputs, as a result of the comparison, an up signal (UP) or a down signal (DN). The charge pump 5 outputs a current corresponding to the up signal or down signal from the phase-frequency comparator 4, and the outputted current is subjected to current-voltage conversion and smoothing (integration) by the loop filter 6 and then applied to a frequency control terminal of the VCO 2. As a result, an output frequency of the VCO 2 is determined by using the frequency of the REF 1 and the division ratio for the variable frequency divider 3 and stabilized. Here, the division ratio for the variable frequency divider 3 is controlled in such a manner that an output from the PLL circuit becomes a desired modulated wave. The division ratio is controlled by the ΔΣ modulator 7, and the ΔΣ modulator 7 generates a division ratio pattern depending on a frequency value Freq_data outputted from the frequency control circuit 8, and outputs the division ratio pattern to the variable frequency divider 3. The frequency value Freq_data outputted from the frequency control circuit 8 first passes through the FF 10 for retiming, and then is obtained by the ΔΣ modulator 7.

Here, the ΔΣ modulator 7 is a CLKdiv domain that operates using a frequency-divided signal CLKdiv which is outputted from the variable frequency divider 3, as a clock, and the frequency control circuit 8 is a CLKref domain that operates using a reference signal CLKref which is outputted from the REF 1, as a clock.

Figure 2:
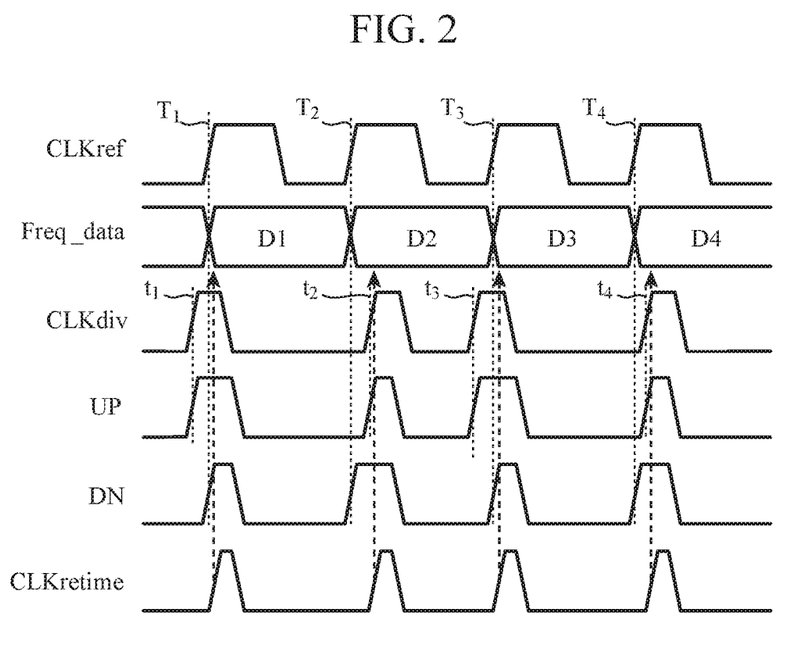
FIG. 2 is a timing chart showing operation waveforms in parts of the PLL circuit of the first embodiment of the invention.

Next, for the operation of the PLL circuit, data transfer from the frequency control circuit 8 that outputs a signal for a frequency value Freq_data, to the ΔΣ modulator 7 will be described. FIG. 2 shows waveforms in parts of the PLL circuit of the first embodiment.

The frequency control circuit 8 operates using CLKref as a clock, and the value of Freq_data which is an output from the frequency control circuit 8 changes at the rising edges (time $T_1$, $T_2$, . . . ) of the CLKref. When an output of the circuit is converged, the PLL circuit operates in such a manner that the rising edges of the respective CLKdiv and CLKref align, but in practice, since the number of divisions of the variable frequency divider 3 temporally changes by fractional operation, the rising edges (time $t_1$, $t_2$, . . . ) of the CLKdiv which is an output from the variable frequency divider 3 are distributed temporally before or after the corresponding rising edges of the CLKref. Hence, when Freq_data is retimed at a rising edge of the CLKdiv, in some cases a phenomenon occurs in which the same value of Freq_data is captured twice or capturing of one value fails. For example, in a case of operation shown in FIG. 2, when the Freq_data is retimed at the rising edges of the CLKdiv, in the Freq_data (D1 to D4), capturing of the values of Freq_data (D1 and D3) fails, and the value of Freq_data (D2) is captured twice.

Hence, in the present embodiment, the Freq_data is retimed using output signals from the phase-frequency comparator 4. An up signal and a down signal which are outputs from the phase-frequency comparator 4 rise at the timings of the rising edges of the CLKdiv and CLKref, respectively, and fall at the same time. By this, a difference between a rising edge of the up signal and a rising edge of the down signal represents a phase difference between the CLKdiv and CLKref. A retiming signal CLKretime which is an output from the AND circuit 9 of the PLL circuit rises after a temporally later one of rising edges of the respective CLKdiv and CLKref. That is, by retiming the Freq_data at the rising edges of the output from the AND circuit 9, always after Freq_data is changed and after a rising edge of the CLKdiv enters, next Freq_data can be captured. This is the principle of operation of the PLL circuit.

By this, for example, even when the fluctuation range of a division ratio by ΔΣ modulation is large and the time-varying range of the rising edges of the CLKdiv is large, the Freq_data can be stably transferred. In addition, for example, when the operation of providing an offset current to an output from the charge pump 5 is performed, a time difference occurs due to misalignment of the rising edges of the CLKref and CLKdiv, but at this time, too, the Freq_data can be stably transferred.

As described above, the PLL circuit of the first embodiment includes the voltage-controlled oscillator that outputs a signal with a frequency depending on a frequency control voltage provided to the voltage-controlled oscillator; a variable frequency divider that frequency-divides the output signal from the voltage-controlled oscillator, on the basis of a signal for a division ratio provided to the variable frequency divider; a phase-frequency comparator that compares a reference signal with an output signal from the variable frequency divider, and outputs an up signal of frequency and a down signal of frequency depending on results of the comparison; an AND circuit that outputs a result of an AND operation between the up signal and the down signal; a frequency control circuit that operates using the reference signal as a clock, and outputs a signal corresponding to an output frequency of the voltage-controlled oscillator; a flip-flop circuit that holds the output signal from the frequency control circuit at timing of an output signal from the AND circuit, and outputs the held output signal; a ΔΣ modulator that operates using the output from the variable frequency divider as a clock, and determines a division ratio for the variable frequency divider on the basis of the output from the flip-flop circuit; a charge pump that outputs a current corresponding to each of the up signal and the down signal; and a loop filter that outputs a signal obtained by performing current-voltage conversion and smoothing on the output from the charge pump, as the frequency control voltage, to the voltage-controlled oscillator, and thus, even when there is a large difference in timing between CLKref and CLKdiv, occurrence of data transfer errors can be prevented.

Second Embodiment

In a second embodiment, instead of an output from the AND circuit 9 of the first embodiment, a reset signal from flip-flops in the phase-frequency comparator 4 is used.

Figure 3A:
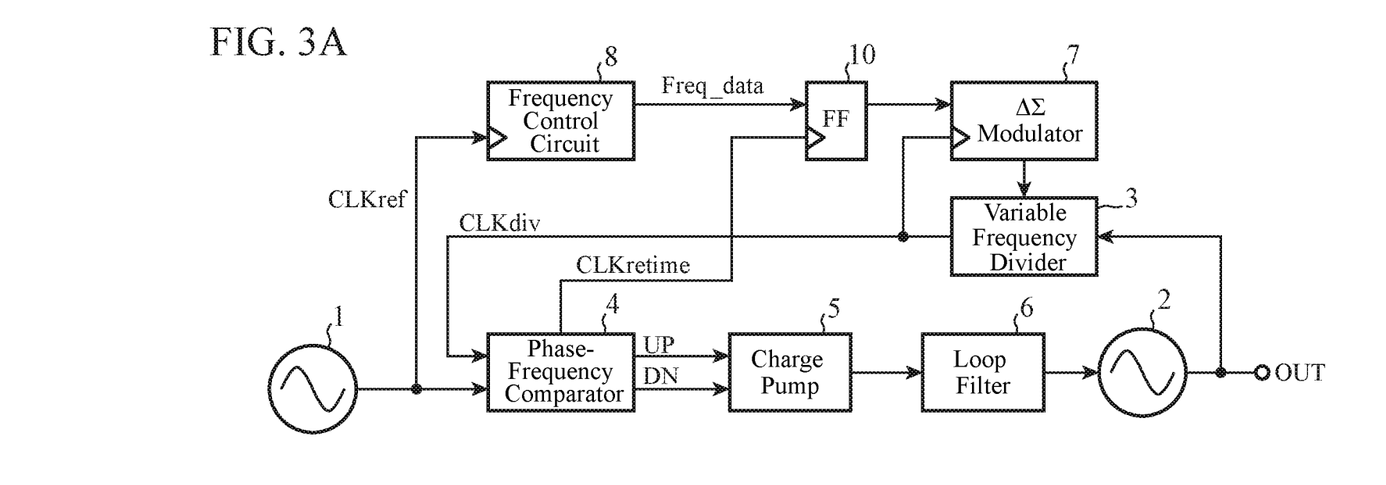
FIG. 3A is a configuration diagram showing a PLL circuit of a second embodiment of the invention.
Figure 3B:
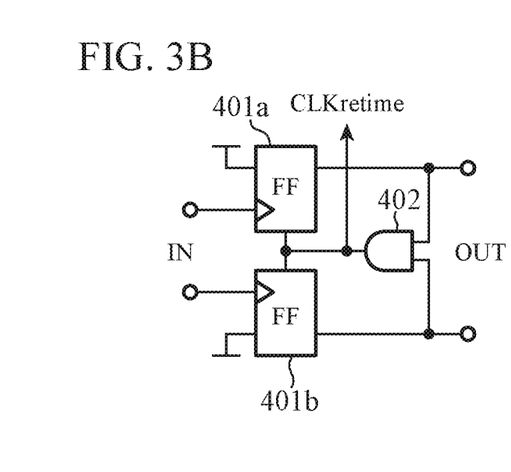
FIG. 3B is a configuration diagram of a phase-frequency comparator.

FIG. 3A is a configuration diagram showing a PLL circuit of the second embodiment, and FIG. 3B is a configuration diagram of the inside of the phase-frequency comparator 4. As shown in FIG. 3A, the PLL circuit of the second embodiment includes the REF 1, the VCO 2, the variable frequency divider 3, the phase-frequency comparator 4, the charge pump 5, the loop filter 6, the ΔΣ modulator 7, the frequency control circuit 8, and the FF 10, and these configurations are the same as those of the first embodiment shown in FIG. 1, except that a retiming signal CLKretime which is an input to the FF 10 is outputted from the phase-frequency comparator 4. Hence, corresponding parts are denoted by the same reference signs and description thereof is omitted.

As shown in FIG. 3B, the phase-frequency comparator 4 is of a tri-state type using a first flip-flop 401a and a second flip-flop 401b. In addition, an AND circuit 402 that outputs a reset signal for resetting the first flip-flop 401a and the second flip-flop 401b is provided. The AND circuit 402 is an arithmetic circuit that performs an AND operation using, as inputs, an up signal which is an output from the first flip-flop 401a and a down signal which is an output from the second flip-flop 401b. Namely, the AND circuit 402 outputs a reset signal when both of an up signal and a down signal are outputted.

Figure 4:
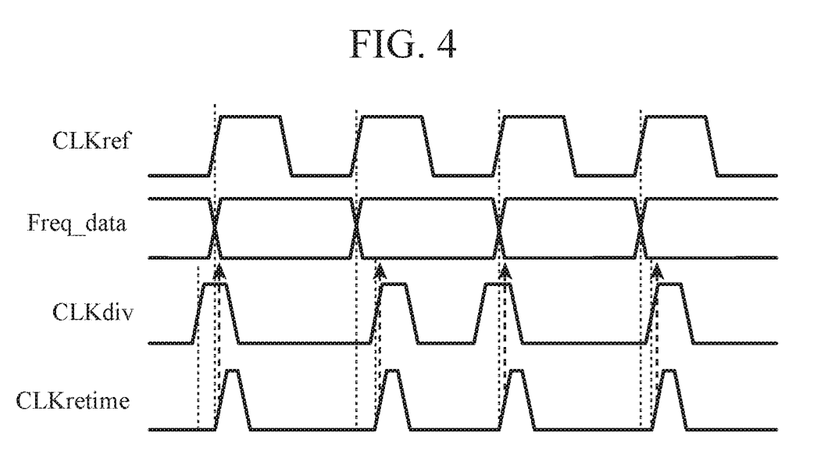
FIG. 4 is a timing chart showing operation waveforms in parts of the PLL circuit of the second embodiment of the invention.

FIG. 4 is an illustrative diagram showing waveforms in parts of the second embodiment.

A retiming signal CLKretime in FIG. 4 is a reset signal outputted from the AND circuit 402. Here, the timing of the reset signal from the AND circuit 402 is the same as the timing of an output signal from the AND circuit 9 of the first embodiment, and thus, in the second embodiment, too, the same advantageous effect as that of the first embodiment can be obtained.

As described above, the PLL circuit of the second embodiment includes the voltage-controlled oscillator that outputs a signal with a frequency depending on a frequency control voltage provided to the voltage-controlled oscillator; a variable frequency divider that frequency-divides the output signal from the voltage-controlled oscillator on the basis of a signal for a division ratio provided to the variable frequency divider; a phase-frequency comparator that compares a reference signal with an output signal from the variable frequency divider, and outputs an up signal of frequency and a down signal of frequency depending on results of the comparison; a frequency control circuit that operates using the reference signal as a clock, and outputs a signal corresponding to an output frequency of the voltage-controlled oscillator; a flip-flop circuit that holds the output signal from the frequency control circuit at timing of a reset signal for flip-flops inside the phase-frequency comparator, and outputs the held output signal; a ΔΣ modulator that operates using the output from the variable frequency divider as a clock, and determines a division ratio for the variable frequency divider on the basis of the output from the flip-flop circuit; a charge pump that outputs a current corresponding to each of the up signal and the down signal; and a loop filter that outputs a signal obtained by performing current-voltage conversion and smoothing on the output from the charge pump, as the frequency control voltage, to the voltage-controlled oscillator, and thus, even when there is a large difference in timing between CLKref and CLKdiv, occurrence of data transfer errors can be prevented.

Third Embodiment

In a third embodiment, a second phase-frequency comparator is provided, and a reset signal from the second phase-frequency comparator is used as a retiming signal.

Figure 5:
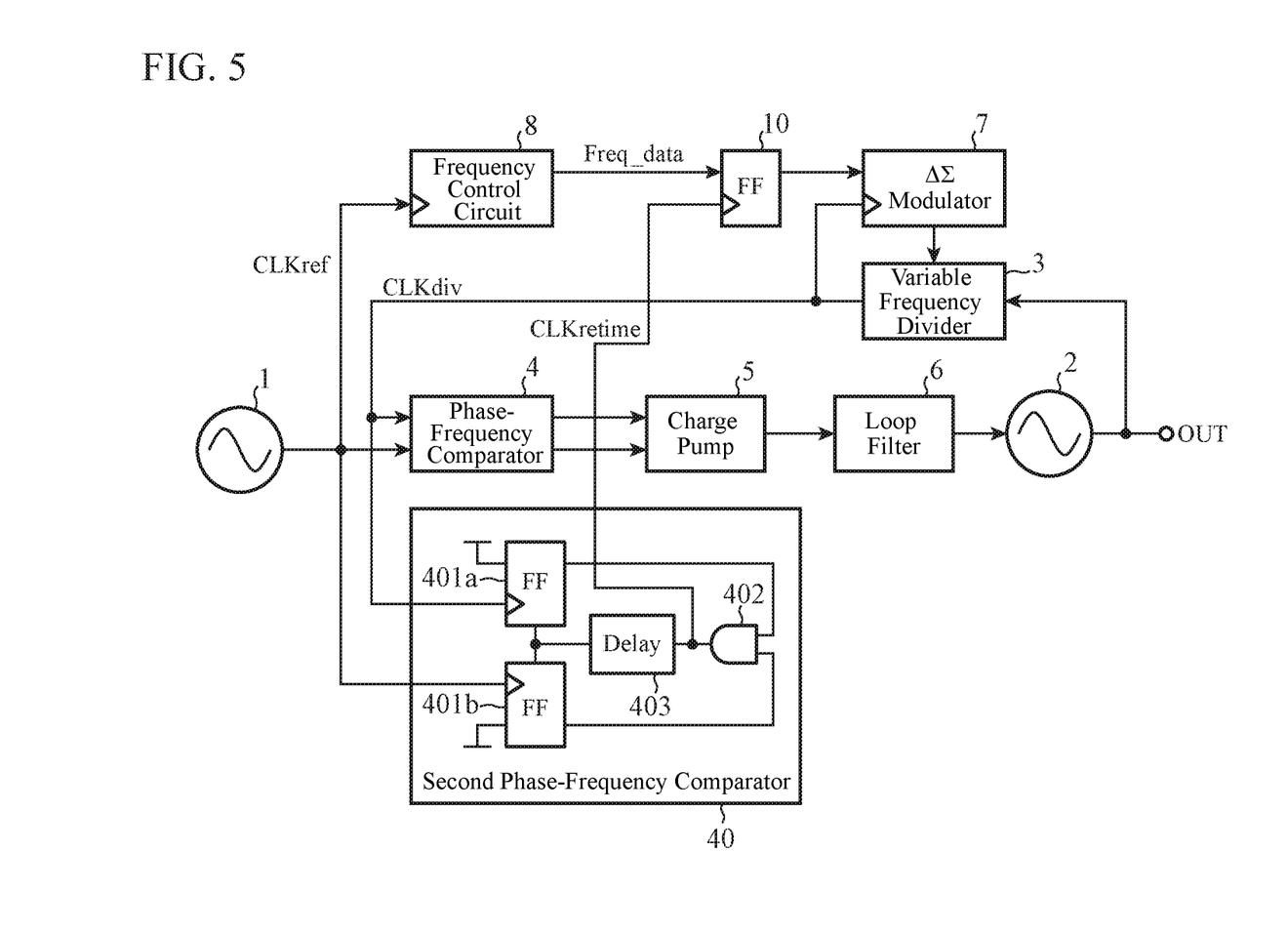
FIG. 5 is a configuration diagram showing a PLL circuit of a third embodiment of the invention.

FIG. 5 is a configuration diagram showing a PLL circuit of the third embodiment. As shown in FIG. 5, the PLL circuit of the third embodiment includes the REF 1, the VCO 2, the variable frequency divider 3, the phase-frequency comparator 4, the charge pump 5, the loop filter 6, the ΔΣ modulator 7, the frequency control circuit 8, the FF 10, and a second phase-frequency comparator 40. Here, the configuration is the same as that of the second embodiment shown in FIG. 3, except that the second phase-frequency comparator 40 is added, and an output signal from the second phase-frequency comparator 40 is used as a retiming signal CLKretime which is an input to the FF 10.

The second phase-frequency comparator 40 includes a first flip-flop 401a, a second flip-flop 401b, an AND circuit 402, and a delay circuit (Delay) 403. Here, the basic configurations of the first flip-flop 401a, the second flip-flop 401b, and the AND circuit 402 are the same as those of the phase-frequency comparator 4 of the second embodiment shown in FIG. 3B. Note, however, that an up signal and a down signal which are outputted from the first flip-flop 401a and the second flip-flop 401b are not outputted to the outside, but are only inputted to the AND circuit 402. In addition, the delay circuit 403 is a delay circuit for outputting an output signal from the AND circuit 402, as a signal with a pulse width of a set time period.

Figure 6:
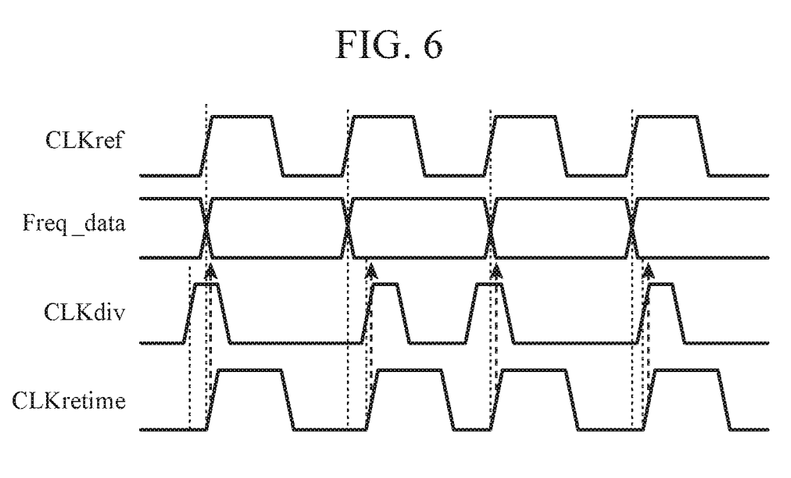
FIG. 6 is a timing chart showing operation waveforms in parts of the PLL circuit of the third embodiment of the invention.

FIG. 6 shows waveforms in parts. By the delay circuit 403, the pulse width of the retiming signal CLKretime is large compared to the pulse width of a retiming signal CLKretime of the second embodiment. When the pulse width of the CLKretime is small, it may be difficult for the FF 10 to surely perform retiming operation, but when the pulse width is large as in the third embodiment, the FF 10 can surely perform retiming operation.

As described above, according to the PLL circuit of the third embodiment, a second phase-frequency comparator that compares a reference signal with an output signal from the variable frequency divider is provided, the second phase-frequency comparator includes a delay circuit that outputs a reset signal for flip-flops inside the second phase-frequency comparator, as a signal with a pulse width of a set time period, and the flip-flop circuit uses the reset signal from the second phase-frequency comparator instead of a reset signal from the phase-frequency comparator, and thus, in addition to the advantageous effect of the first embodiment, retiming can be more surely performed.

Fourth Embodiment

In a fourth embodiment, a retiming signal CLKretime is directly used as a clock for allowing the ΔΣ modulator 7 to operate.

Figure 7:
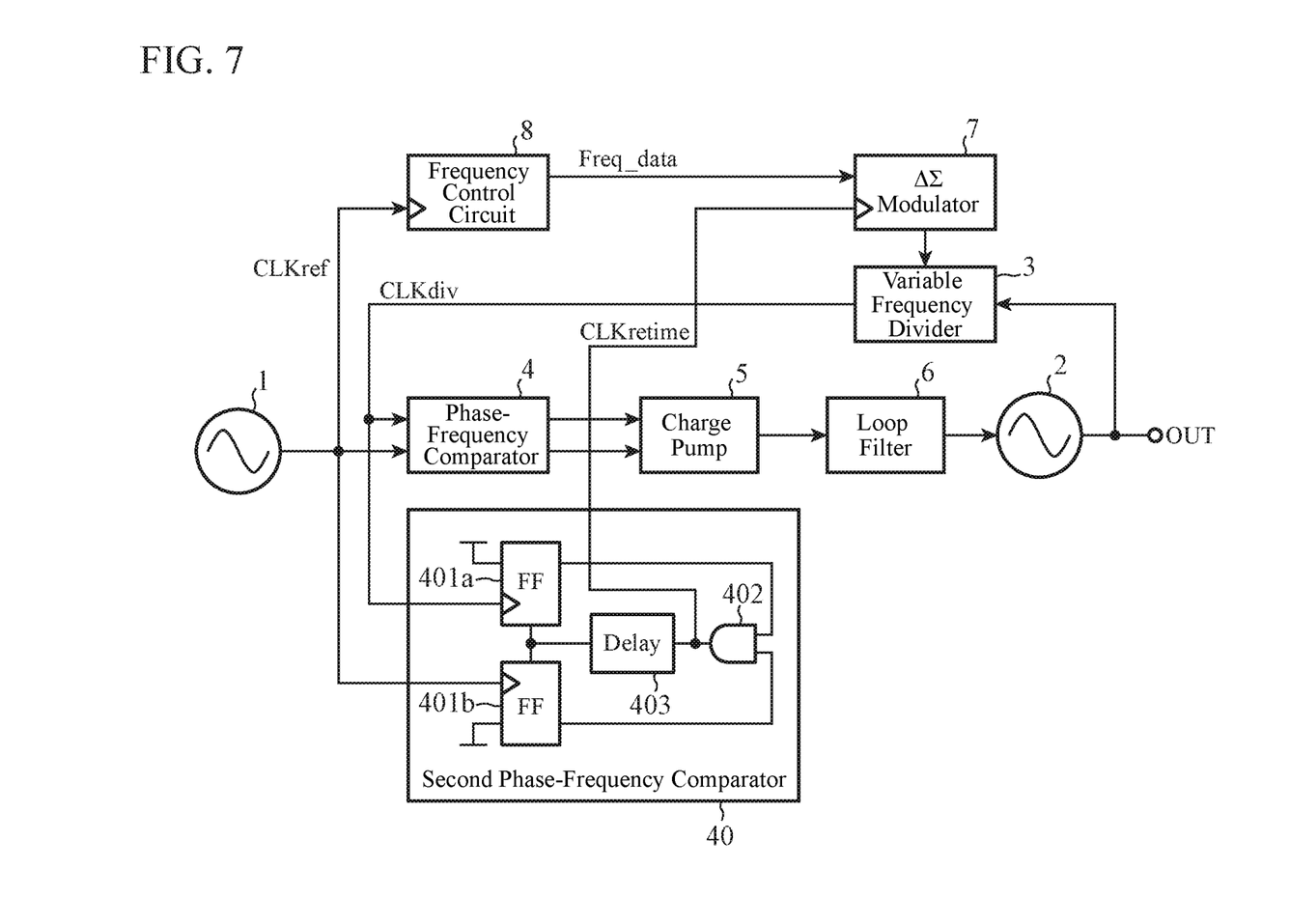
FIG. 7 is a configuration diagram showing a PLL circuit of a fourth embodiment of the invention.

FIG. 7 is a configuration diagram showing a PLL circuit of the fourth embodiment.

The PLL circuit of the fourth embodiment includes the REF 1, the VCO 2, the variable frequency divider 3, the phase-frequency comparator 4, the charge pump 5, the loop filter 6, the ΔΣ modulator 7, the frequency control circuit 8, and the second phase-frequency comparator 40. Namely, in the fourth embodiment, the FF 10 of the third embodiment is not provided, and a retiming signal CLKretime from the second phase-frequency comparator 40 is directly inputted to the ΔΣ modulator 7.

By such a configuration, operation waveforms in parts are the same as those of FIG. 6 in the third embodiment. The ΔΣ modulator 7 uses, as a clock, the retiming signal CLKretime instead of an output CLKdiv from the variable frequency divider 3, and thus, can surely obtain a frequency value Freq_data which is an output from the frequency control circuit 8.

As described above, the PLL circuit of the fourth embodiment includes the voltage-controlled oscillator that outputs a signal with a frequency depending on a frequency control voltage provided to the voltage-controlled oscillator; a variable frequency divider that frequency-divides the output signal from the voltage-controlled oscillator on the basis of a signal for a division ratio provided to the variable frequency divider; a phase-frequency comparator that compares a reference signal with an output signal from the variable frequency divider, and outputs an up signal of frequency and a down signal of frequency depending on results of the comparison; a second phase-frequency comparator that compares the reference signal with the output signal from the variable frequency divider, and that includes a delay circuit that outputs a reset signal for flip-flops inside the second phase-frequency comparator, as a signal with a pulse width of a set time period; a frequency control circuit that operates using the reference signal as a clock, and outputs a signal corresponding to an output frequency of the voltage-controlled oscillator; a ΔΣ modulator that operates using the reset signal from the second phase-frequency comparator as a clock, and determines a division ratio for the variable frequency divider on the basis of the output from the frequency control circuit; a charge pump that outputs a current corresponding to each of the up signal and the down signal from the phase-frequency comparator; and a loop filter that outputs a signal obtained by performing current-voltage conversion and smoothing on the output from the charge pump, as the frequency control voltage, to the voltage-controlled oscillator, and thus, in addition to the advantageous effect of the first embodiment, a flip-flop circuit becomes unnecessary, thereby enabling to reduce the circuit area and achieve a reduction in power consumption.

Note that in the invention of the present application, a free combination of the embodiments, modifications to any component of the embodiments, or omissions of any component in the embodiments are possible within the scope of the invention.

INDUSTRIAL APPLICABILITY

As described above, a PLL circuit according to the invention has a configuration for controlling timing upon performing data transfer between circuits with different clock domains, and is suitable for use as a PLL circuit that generates, for example, a chirp signal which is used as a transmission wave of an FMCW radar.

REFERENCE SIGNS LIST

1: Reference signal source (REF), 2: Voltage-controlled oscillator (VCO), 3: Variable frequency divider, 4: Phase-frequency comparator, 5: Charge pump, 6: Loop filter, 7: ΔΣ modulator, 8: Frequency control circuit, 9: AND circuit, 10: Flip-flop circuit (FF), 40: Second phase-frequency comparator, 401a: First flip-flop, 401b: Second flip-flop, 402: AND circuit, 403: Delay circuit.

The invention claimed is:

1. A PLL circuit comprising:
a voltage-controlled oscillator to output a signal with a frequency depending on a frequency control voltage provided to the voltage-controlled oscillator;
a variable frequency divider to frequency-divide the output signal from the voltage-controlled oscillator on a basis of a signal for a division ratio provided to the variable frequency divider;
a phase-frequency comparator to compare a reference signal with an output signal from the variable frequency divider, and output an up signal of frequency and a down signal of frequency depending on results of the comparison;
an AND circuit to output a result of an AND operation between the up signal and the down signal;
a frequency control circuit to operate using the reference signal as a clock, and output a signal corresponding to an output frequency of the voltage-controlled oscillator;

a flip-flop circuit to hold the output signal from the frequency control circuit at timing of an output signal from the AND circuit, and output the held output signal;

a ΔΣ modulator to operate using the output from the variable frequency divider as a clock, and determine a division ratio for the variable frequency divider on a basis of the output from the flip-flop circuit;

a charge pump to output a current corresponding to each of the up signal and the down signal; and a loop filter to output a signal obtained by performing current-voltage conversion and smoothing on the output from the charge pump, as the frequency control voltage, to the voltage-controlled oscillator.

2. A PLL circuit comprising:

a voltage-controlled oscillator to output a signal with a frequency depending on a frequency control voltage provided to the voltage-controlled oscillator;

a variable frequency divider to frequency-divide the output signal from the voltage-controlled oscillator on a basis of a signal for a division ratio provided to the variable frequency divider;

a phase-frequency comparator to compare a reference signal with an output signal from the variable frequency divider, and output an up signal of frequency and a down signal of frequency depending on results of the comparison;

a frequency control circuit to operate using the reference signal as a clock, and output a signal corresponding to an output frequency of the voltage-controlled oscillator;

a flip-flop circuit to hold the output signal from the frequency control circuit at timing of a reset signal for flip-flops inside the phase-frequency comparator, and output the held output signal;

a ΔΣ modulator to operate using the output from the variable frequency divider as a clock, and determine a division ratio for the variable frequency divider on a basis of the output from the flip-flop circuit;

a charge pump to output a current corresponding to each of the up signal and the down signal; and a loop filter to output a signal obtained by performing current-voltage conversion and smoothing on the output from the charge pump, as the frequency control voltage, to the voltage-controlled oscillator.

3. The PLL circuit according to claim 2, wherein
a second phase-frequency comparator to compare the reference signal with the output signal from the variable frequency divider is provided, the second phase-frequency comparator includes a delay circuit to output a reset signal for flip-flops inside the second phase-frequency comparator, as a signal with a pulse width of a set time period, and the flip-flop circuit uses the reset signal from the second phase-frequency comparator instead of the reset signal from the phase-frequency comparator.

4. A PLL circuit comprising:

a voltage-controlled oscillator to output a signal with a frequency depending on a frequency control voltage provided to the voltage-controlled oscillator;

a variable frequency divider to frequency-divide the output signal from the voltage-controlled oscillator on a basis of a signal for a division ratio provided to the variable frequency divider;

a phase-frequency comparator to compare a reference signal with an output signal from the variable frequency divider, and output an up signal of frequency and a down signal of frequency depending on results of the comparison;

a second phase-frequency comparator to compare the reference signal with the output signal from the variable frequency divider, the second phase-frequency comparator including a delay circuit to output a reset signal for flip-flops inside the second phase-frequency comparator, as a signal with a pulse width of a set time period;

a frequency control circuit to operate using the reference signal as a clock, and output a signal corresponding to an output frequency of the voltage-controlled oscillator;

a ΔΣ modulator to operate using the reset signal from the second phase-frequency comparator as a clock, and determine a division ratio for the variable frequency divider on a basis of the output from the frequency control circuit;

a Charge pump to output a current corresponding to each of the up signal and the down signal from the phase-frequency comparator; and a loop filter to output a signal obtained by performing current-voltage conversion and smoothing on the output from the charge pump, as the frequency control voltage, to the voltage-controlled oscillator.

* * * * *